(12) United States Patent
Sung et al.

(10) Patent No.: US 9,659,530 B2
(45) Date of Patent: May 23, 2017

(54) DISPLAY (71) Applicant: INNOLUX CORPORATION, Chu-Nan, Miao-Li County (TW)

(72) Inventors: Li-Wei Sung, Chu-Nan (TW); Yen-Wei Chen, Chu-Nan (TW); Chung-Lin Tsai, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/812,286

(22) Filed: Jul. 29, 2015

(65) Prior Publication Data

US 2015/0332629 A1 Nov. 19, 2015

Related U.S. Application Data (63) Continuation of application No. 13/102,334, filed on May 6, 2011, now Pat. No. 9,123,282.

(30) Foreign Application Priority Data

May 11, 2010 (TW) .............................. 99114964 A (51) Int. Cl.
 G09G 3/36 (2006.01)
 G09G 3/3266 (2016.01)
 (Continued)

(52) U.S. Cl.
 CPC ............. G09G 3/3266 (2013.01); G09G 3/20 (2013.01); G09G 3/2011 (2013.01);
 (Continued)

(58) Field of Classification Search
 CPC ...... G09G 3/20; G09G 3/2011; G09G 3/3266; G09G 2310/0286
 See application file for complete search history.

(56) References Cited

U.S. PATENT DOCUMENTS

8,629,828 B2 1/2014 Jinta
8,730,145 B2 5/2014 Jinta
(Continued)

Primary Examiner — Michael J Eurice
(74) Attorney, Agent, or Firm — Liu & Liu (57) ABSTRACT A display is disclosed. The display comprises a panel, a data driver and a scan driver. The panel comprises pixels, data lines and scan lines. The data lines transmit data signals to the pixels, and the scan lines transmit scan signals to the pixels. The data driver provides the data signals, and the scan driver provides the scan signals. The scan driver comprises a shift register circuit. The shift register circuit comprises an $i+1^{th}$ stage carry shift register, an $i^{th}$ stage carry shift register and a $j^{th}$ stage buffer shift register. The $i^{th}$ stage carry shift register generates an $i+1^{th}$ start signal to start the $i+1^{th}$ stage carry shift register, so that the $i+1^{th}$ stage carry shift register generates an $i+2^{th}$ start signal. The $i+1^{th}$ start signal starts the $j^{th}$ stage buffer shift register to generate a $j^{th}$ output signal.

10 Claims, 11 Drawing Sheets (51) Int. Cl.
  *G09G 3/20* (2006.01)
  *G11C 19/28* (2006.01)

(52) U.S. Cl.
  CPC ... *G11C 19/287* (2013.01); *G09G 2310/0224* (2013.01); *G09G 2310/0286* (2013.01); *G09G 2320/0219* (2013.01)

(56) References Cited

U.S. PATENT DOCUMENTS

| | | |
|---|---|---|
| 2001/0005196 A1 | 6/2001 | Ishii |
| 2001/0050678 A1 | 12/2001 | Nishikubo et al. |
| 2002/0150199 A1* | 10/2002 | Sasaki ............... G11C 8/04 377/64 |
| 2002/0167026 A1 | 11/2002 | Azami et al. |
| 2003/0034806 A1* | 2/2003 | Azami ............ G09G 3/3688 327/94 |
| 2003/0058234 A1 | 3/2003 | Kanzaki et al. |
| 2003/0128180 A1* | 7/2003 | Kim ............... G09G 3/3677 345/100 |
| 2003/0189542 A1* | 10/2003 | Lee ............... G09G 3/3648 345/93 |
| 2003/0227433 A1 | 12/2003 | Moon |
| 2003/0231735 A1 | 12/2003 | Moon et al. |
| 2003/0234761 A1 | 12/2003 | Washio |
| 2004/0104882 A1* | 6/2004 | Kitani ............. G09G 3/3677 345/100 |
| 2004/0150610 A1 | 8/2004 | Zebedee et al. |
| 2004/0189584 A1 | 9/2004 | Moon |
| 2005/0083292 A1 | 4/2005 | Moon et al. |
| 2005/0185752 A1* | 8/2005 | Sasaki ............... G11C 8/04 377/64 |
| 2006/0210012 A1* | 9/2006 | Yamaguchi ........... G11C 19/00 377/64 |
| 2006/0220587 A1 | 10/2006 | Tobita et al. |
| 2006/0267912 A1* | 11/2006 | Lee ............... G09G 3/3266 345/100 |
| 2006/0291298 A1 | 12/2006 | Kang et al. |
| 2007/0057899 A1* | 3/2007 | Yamashita ......... G09G 3/3677 345/100 |
| 2007/0075959 A1* | 4/2007 | Tobita .............. G09G 3/20 345/98 |
| 2008/0088561 A1* | 4/2008 | Kawabe ............ G09G 3/2029 345/92 |
| 2008/0101529 A1 | 5/2008 | Tobita |
| 2008/0116944 A1 | 5/2008 | Tobita et al. |
| 2008/0246716 A1 | 10/2008 | Miyake et al. |
| 2008/0246717 A1 | 10/2008 | Miyake et al. |
| 2009/0027318 A1 | 1/2009 | Murakami et al. |
| 2009/0251443 A1 | 10/2009 | Jinta |
| 2010/0007653 A1* | 1/2010 | Ahn ............... G09G 3/3677 345/214 |
| 2010/0026669 A1* | 2/2010 | Lee ................ G11C 19/28 345/204 |
| 2010/0141641 A1* | 6/2010 | Furuta .............. G11C 19/184 345/213 |
| 2010/0238156 A1 | 9/2010 | Iwamoto et al. |
| 2011/0141075 A1* | 6/2011 | Chiang ............. G11C 19/28 345/205 |

* cited by examiner

DISPLAY

This application is a continuation application of U.S. application Ser. No. 13/102,334, filed on May 6, 2011, which claims the benefit of Taiwan application Serial No. 99114964, filed May 11, 2010, the subject matter of which is incorporated herein by reference.

BACKGROUND

Technical Field

The disclosure relates in general to a display, and more particularly to a display capable of independently generating start signals and output signals respectively.

Description of the Related Art

Figure 1:
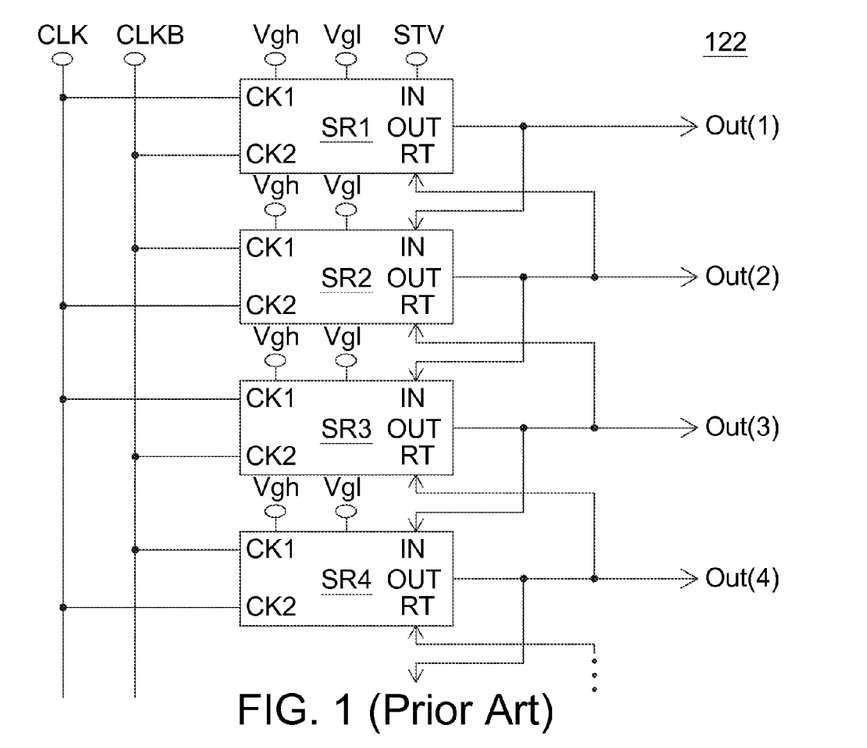
FIG. 1 shows a conventional shift register circuit.
Figure 2:
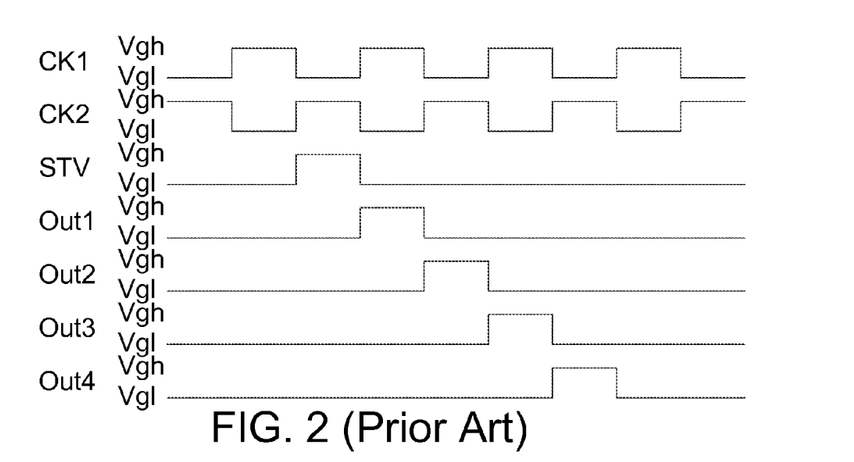
FIG. 2 shows a signal timing diagram of FIG. 1.

Referring to FIG. 1 and FIG. 2. FIG. 1 shows a conventional shift register circuit. FIG. 2 shows a signal timing diagram of FIG. 1. The conventional shift register circuit 122 comprises a plurality of stages of shift registers. For convenience of elaboration, the shift registers are exemplified by a first stage shift register SR1 to a fourth stage shift register SR4. The first stage shift register SR1 to the fourth stage shift register SR4 generate a first stage output signal O1 to a fourth stage output signal O4. The first stage output signal O1 generated by the first stage shift register SR1 is inputted to start the second stage shift register SR2 to generate a second stage output signal O2. The second stage output signal O2 generated by the second stage shift register SR2 is inputted to start the third stage shift register SR3 to generate a third stage output signal O3. The third stage output signal O3 generated by the third stage shift register SR3 is inputted to start the fourth stage shift register SR4 to generate a fourth stage output signal O4. The operation of the output signals of other stages can be obtained in the same manner.

Figure 3:
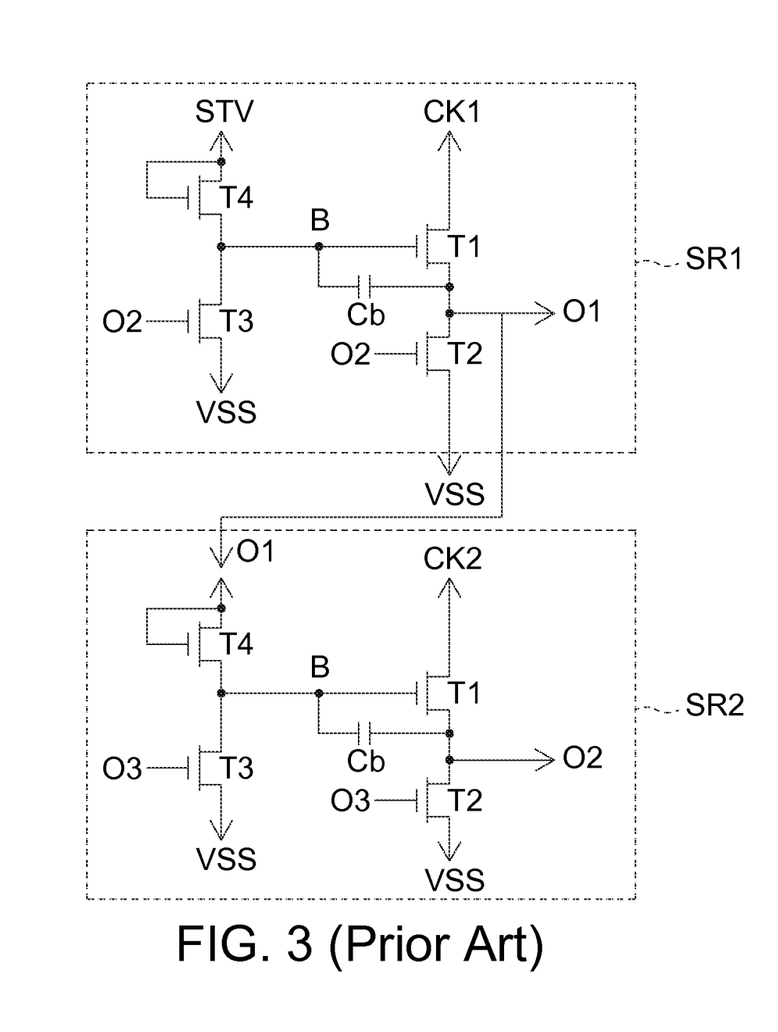
FIG. 3 shows a circuit diagram of a first conventional shift register.

Referring to FIG. 3, a circuit diagram of a first conventional shift register is shown. The first stage shift register SR1 comprises transistors T1~T4. The transistor T1 outputs a first stage output signal O1 according to a clock signal CK1. The transistor T2 is coupled to the transistor T1 and controlled by the second stage output signal O2 outputted from the second stage shift register SR. The transistor T3 is controlled by the second stage output signal O2 outputted from the second stage buffer shift register SR2. The transistor T4 is coupled to the transistor T3 for driving the transistor T1 according to the first stage start signal STV. The transistor T2 is coupled to the transistor T1 and a coupling capacitor Cb. The circuit design of the second stage shift register SR2 is similar to that of the first stage carry shift register SR1, and the similarities are not repeated here.

Figure 4:
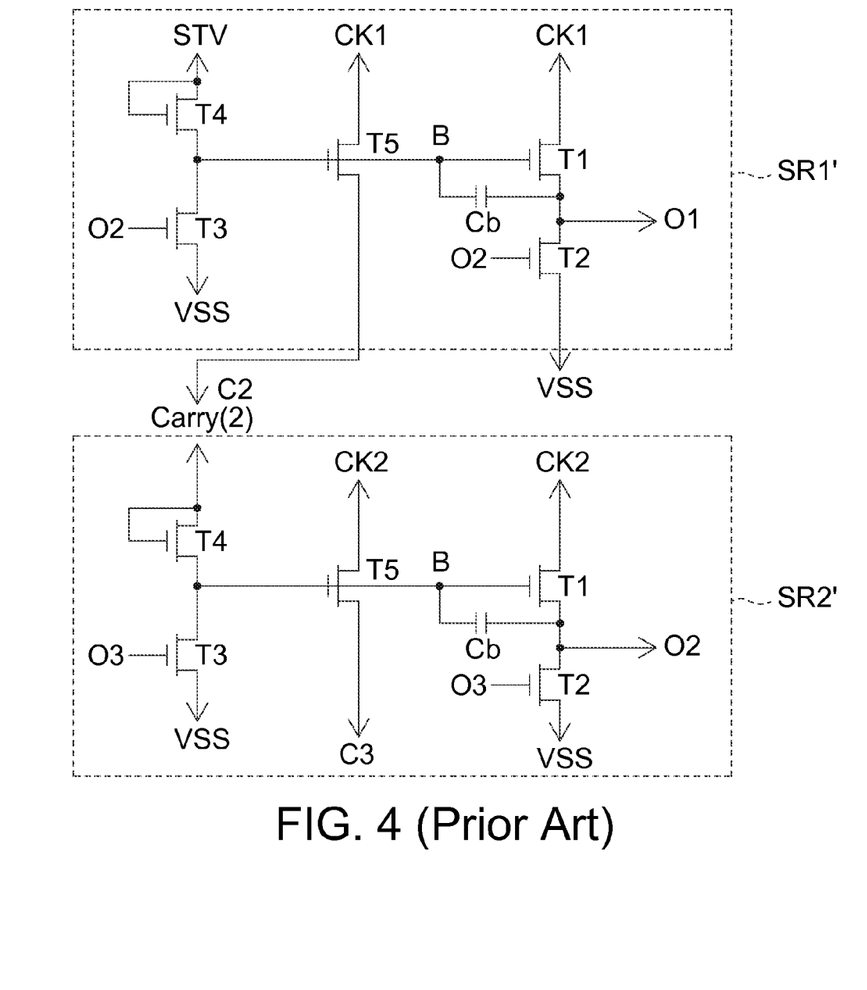
FIG. 4 shows a circuit diagram of a second conventional shift register.

Referring to FIG. 4, a circuit diagram of a second conventional shift register is shown. FIG. 4 is different from of FIG. 3 in that the shift registers SR1' and SR2' of FIG. 4 further comprise a transistor T5. The transistor T5 is controlled by the potential of a node B to selectively output a start signal C2 to start the shift register SR2 according to the clock signal CK1.

In the display region (also referred as active matrix array region) of the display panel, the scan lines and the data lines are interlaced, when the voltage on the data lines varies, the voltage on the scan lines varies as well. Thus, the output signal of the conventional shift register circuit will be interfered with by the noises. When the output signal interfered with by the noises is inputted to the next stage shift register, the noises will be amplified and cause abnormal operation to the shift register circuit.

SUMMARY

The disclosure is directed to a display, which adopts a carry shift register to independently output a start signal and adopts a buffer shift register to independently output an output signal. Since the buffer shift register and the carry shift register are divided into two independent loops, the output signal generated by the buffer shift register will not be used as a start signal in the next stage. When the buffer shift register is interfered with by noises, the noises will not be inputted to the next stage. Thus, the abnormal operation of the shift register circuit due to the amplification of the noises will not occur.

According to a first aspect of the present disclosure, a display is provided. The display comprises a panel, a data driver and a scan driver. The panel comprises pixels, data lines and scan lines. The data lines transmit data signals to the pixels, and the scan lines transmit scan signals to the pixels. The data driver provides the data signals, and the scan driver provides the scan signals. The scan driver comprises a shift register circuit. The shift register circuit comprises a plurality of stages of carry shift registers and a plurality of stages of buffer shift registers. The carry shift registers generates a plurality of start signals comprising an $i+1^{th}$ start signal and an $i+2^{th}$ start signal. The carry shift registers comprise an $i+1^{th}$ stage carry shift register and an $i^{th}$ stage carry shift register. The $i^{th}$ stage carry shift register generates an $i+1^{th}$ start signal to start the $i+1^{th}$ stage carry shift register, so that the $i+1^{th}$ stage carry shift register generates an $i+2^{th}$ start signal. The buffer shift registers generates a plurality of output signals comprising a $j^{th}$ output signal and respectively corresponding to a plurality of scan signals. These stages of buffer shift registers comprise a $j^{th}$ stage buffer shift register. The $i+1^{th}$ start signal starts the $j^{th}$ stage buffer shift register to generate a $j^{th}$ output signal The above and other aspects of the disclosure will become better understood with regard to the following detailed description of the non-limiting embodiment(s). The following description is made with reference to the accompanying drawings.

DETAILED DESCRIPTION

Figure 5:
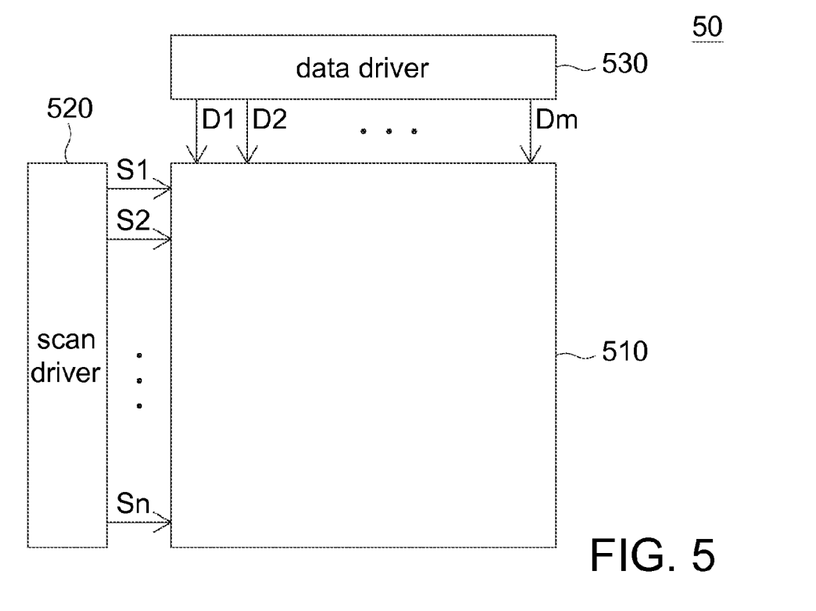
FIG. 5 shows a display.
Figure 6:
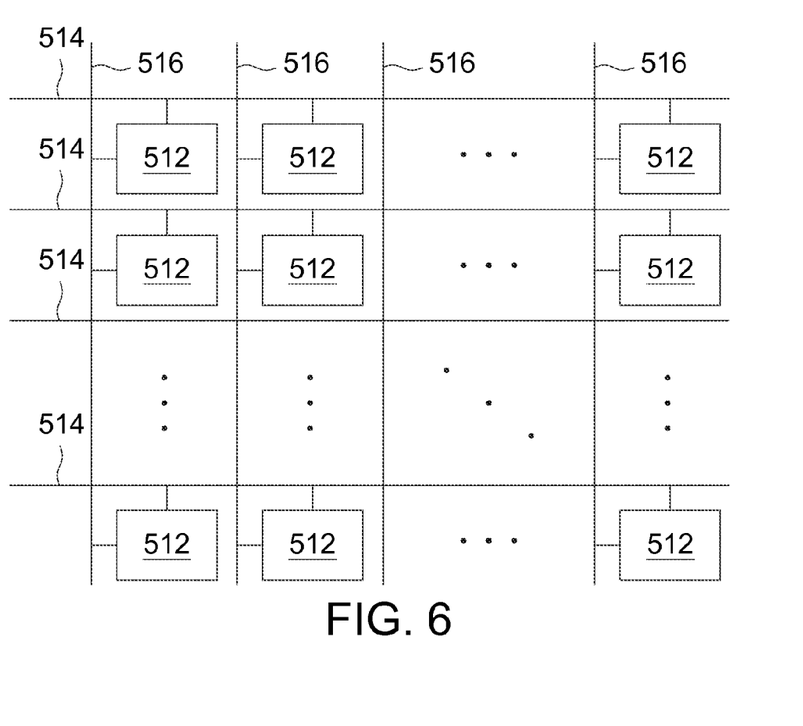
FIG. 6 shows a panel.

Referring to both FIG. 5 and FIG. 6. FIG. 5 shows a display. FIG. 6 shows a panel. The display 50 comprises a panel 510, a scan driver 520 and a data driver 530. The panel 510 comprises pixels 512, scan lines 514 and data lines 516. The data driver 530 provides the data signals D1~Dm, and the scan driver 520 provides the scan signals S1~Sn. The data lines 516 transmit the data signals D1~Dm to the pixels 512, and the scan lines 514 transmit the scan signals S1~Sn to the pixels 512. The scan driver 520 can be realized by such as an amorphous silicon gate (ASG) and can be formed on the panel 510.

The scan driver 520 comprises a shift register circuit which provides output signals respectively corresponding to the scan signals S1~Sn. The shift register circuit adopts a carry shift register to independently output a start signal and adopts a buffer shift register to independently output an output signal. Since the buffer shift register and the carry shift register are divided into two independent loops, the output signal generated by the buffer shift register will not be used as a start signal in the next stage. Thus, when the buffer shift register is interfered with by noises, the noises will not be inputted to the next stage. Thus, the abnormal operation of the shift register circuit due to the amplification of the noises will not occur. The composition of the shift register circuit is elaborated below with a plurality of embodiments.

First Embodiment

Figure 7:
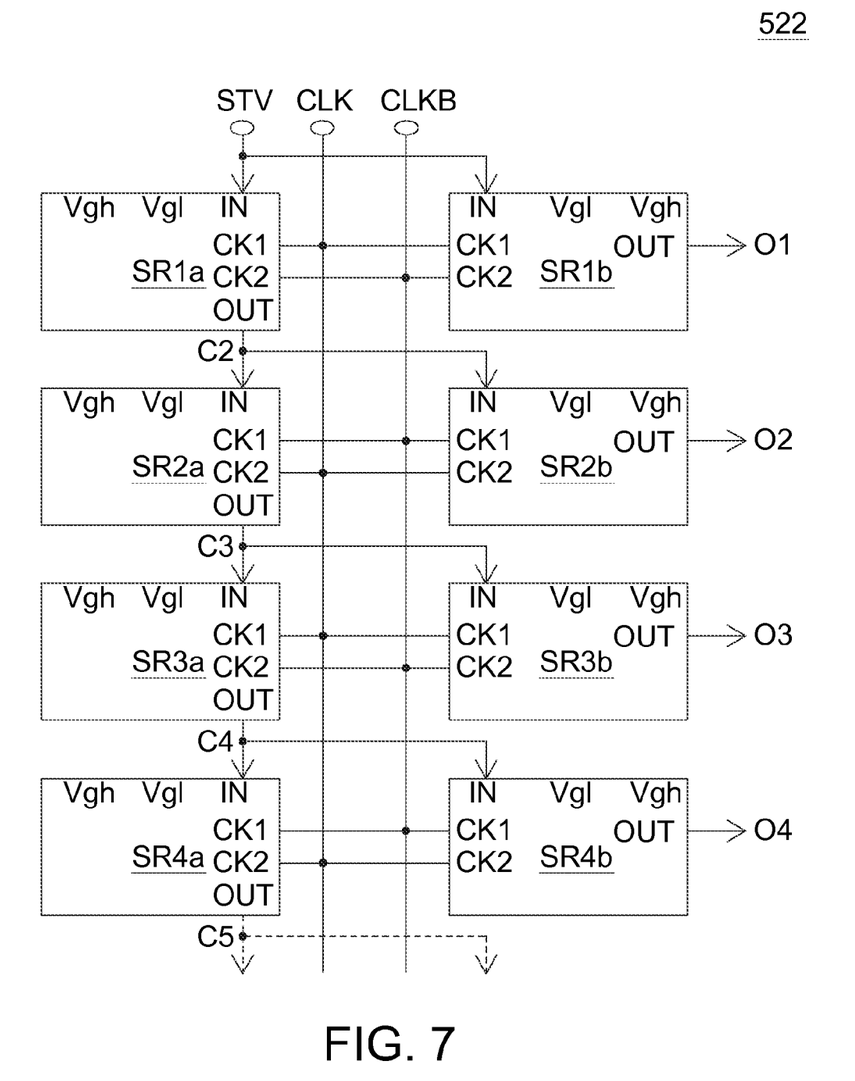
FIG. 7 shows a partial view of a shift register circuit according to a first embodiment of the disclosure.

Referring to FIG. 7, a partial view of a shift register circuit according to a first embodiment of the disclosure is shown. In the first embodiment, one stage of carry shift register goes with one stage of buffer shift register. The scan driver 520 further comprises a shift register circuit 522. The shift register circuit 522 outputs a first stage output signal O1 to a fourth stage output signal O4 respectively corresponding to the scan signals S1~S4. The shift register circuit 522 comprises a first stage carry shift register SR1a to a fourth stage carry shift register SR4a and a first stage buffer shift register SR1b to a fourth stage buffer shift register SR4b. It is noted that in the shift register circuit 522, the number of the carry shift registers is the same with that of the buffer shift registers. The first stage carry shift register SR1a to the fourth stage carry shift register SR4a respectively generate a second stage start signal C2 to a fifth stage start signal C5. The first stage buffer shift register SR1b to the fourth stage buffer shift register SR4b respectively generate the first stage output signal O1 to the fourth stage output signal O4. The first stage output signal O1 to the fourth stage output signal O4 and the first stage start signal C1 to the fourth stage start signal C4 are respectively generated synchronically.

The first stage start signal STV starts the first stage carry shift register SR1a to generate a second stage start signal C2', and further starts the first stage buffer shift register SR1b to output a first stage output signal O1. The second stage start signal C2 starts the second stage carry shift register SR2a to generate a third stage start signal C3, and further starts the second stage buffer shift register SR2b to output a second stage output signal O2. The third stage start signal C3 starts the third stage carry shift register SR3a to generate a fourth stage start signal C4, and further starts the third stage buffer shift register SR3b to output a third stage output signal O3. The fourth stage start signal C4 starts the fourth stage carry shift register SR4a to generate a fifth stage start signal C5, and further starts the fourth stage buffer shift register SR4b to output a fourth stage output signal O4. By the same token, in subsequent stages, the principles of the operations of the carry shift registers and the buffer shift registers are similar to that illustrated in the above disclosure, and the similarities are not repeated here.

In the display region (also referred as active matrix array region) of the display panel, the scan lines and the data lines are interlaced, and when the voltage on the data lines varies, the voltage on the scan lines will varies as well. Thus, the output signal of the conventional shift register circuit will be interfered with by the noises. When the output signal interfered with by the noises is inputted to the next stage shift register, the noises will be amplified and cause abnormal operation to the shift register circuit.

To the contrary, in the first embodiment, since the buffer shift register and carry shift register are divided into two independent loops, the output signal generated by the buffer shift register will not be used as a start signal in the next stage. Thus, when the buffer shift register is interfered with by noises, the noises will not be inputted to the next stage. Thus, the abnormal operation of the shift register circuit due to the amplification of the noises will not occur.

Figure 8:
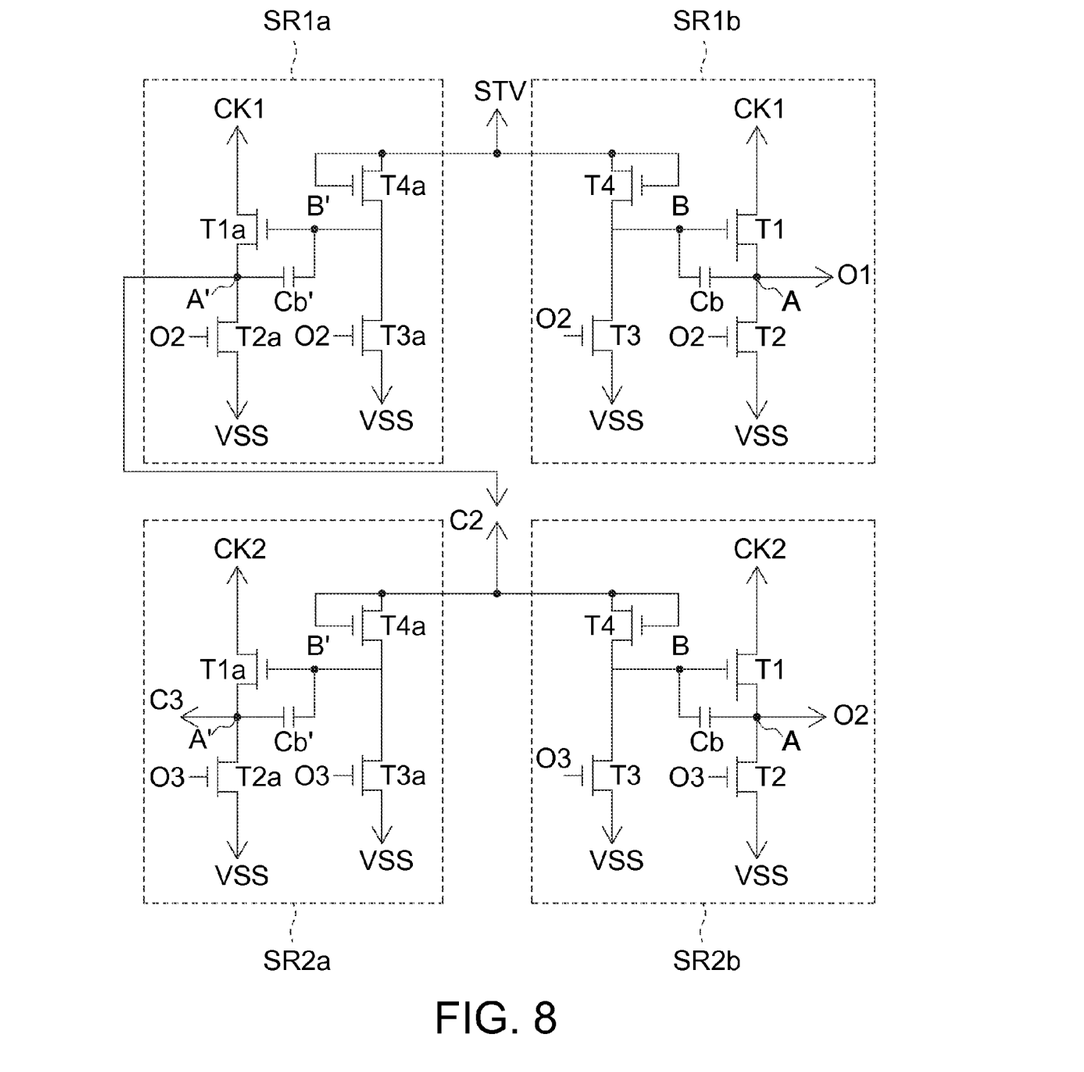
FIG. 8 shows a first circuit diagram of carry shift register and buffer shift register.
Figure 9:
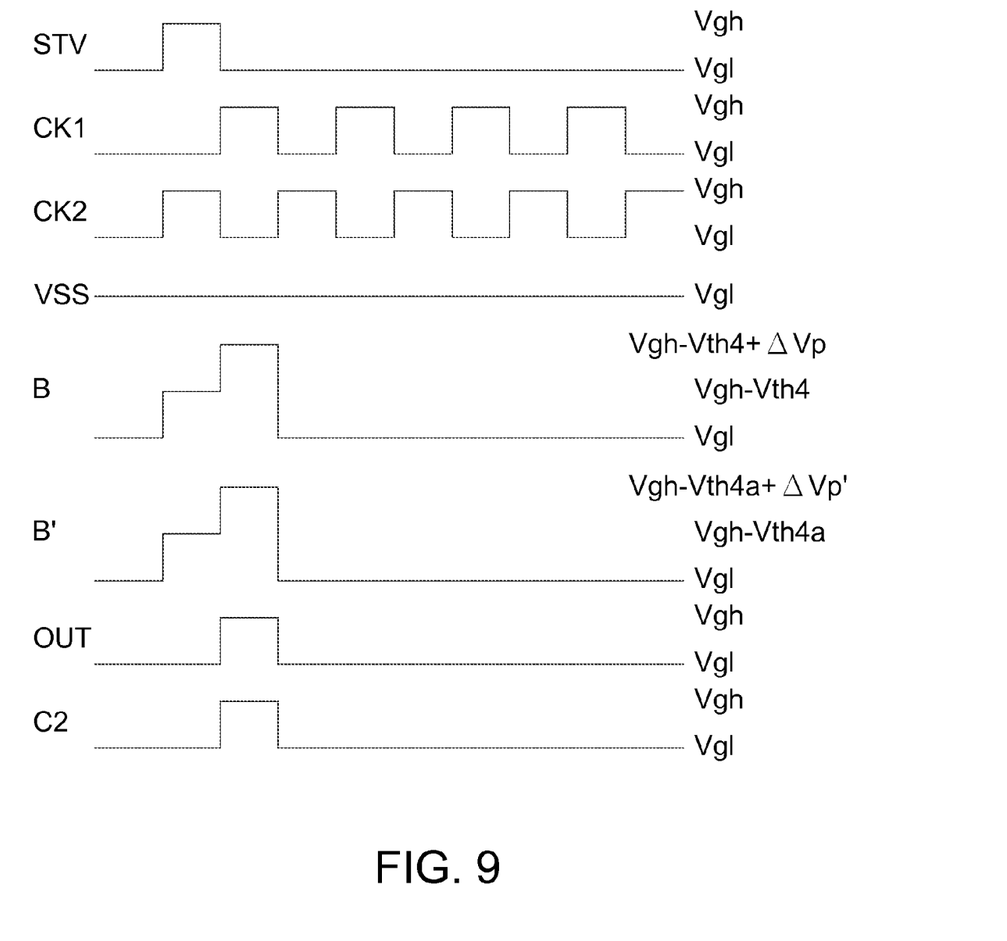
FIG. 9 shows a timing diagram of the signals of FIG. 8.

Referring to both FIG. 8 and FIG. 9. FIG. 8 shows a first circuit diagram of carry shift register and buffer shift register. FIG. 9 shows a timing diagram of the signals of FIG. 8. The first stage carry shift register SR1a comprises transistors T1a~T4a. The buffer shift register SR1b comprises transistors T1~T4. The area ratio of the transistor T1 to that of the transistor T1a is about 5~20. The transistor T1 outputs a first stage output signal O1 at node A according to clock signal CK1. The transistor T2 is coupled to the transistor T1 and controlled by the second stage output signal O2 outputted from the second stage buffer shift register SR2b. The transistor T3 is controlled by the second stage output signal O2 outputted from the second stage buffer shift register SR2b. The transistor T4 is coupled to the transistor T3 via the node B for driving the transistor T1 according to the first stage start signal STV. The transistor T2 is coupled to the transistor T1 and transistor T2 via a coupling capacitor Cb. The circuit design of the second stage carry shift register SR2a is identical to that of the first stage carry shift register SR1a, and the similarities are not repeated here.

The circuit design of the first stage buffer shift register SR1b is substantially identical to that of the first stage carry shift register SR1a. The transistor T1a outputs a second stage start signal C2 at the node A' according to the clock signal CK1. The transistor T2a is coupled to the transistor T1a via the node A' and controlled by the second stage output signal O2 outputted from the second stage buffer shift register SR2b. The transistor T3a is controlled by the second stage output signal O2 outputted from the second stage buffer shift register SR2. The transistor T4a is coupled to the transistor T3a via the node B' for driving the transistor T1a according to the first stage start signal STV. The transistor T2a is coupled to the transistor T1a via a coupling capacitor Cb'. The circuit design of the second stage buffer shift register SR2b is identical to that of the first stage buffer shift register SR1b, and the similarities are not repeated here.

Figure 10:
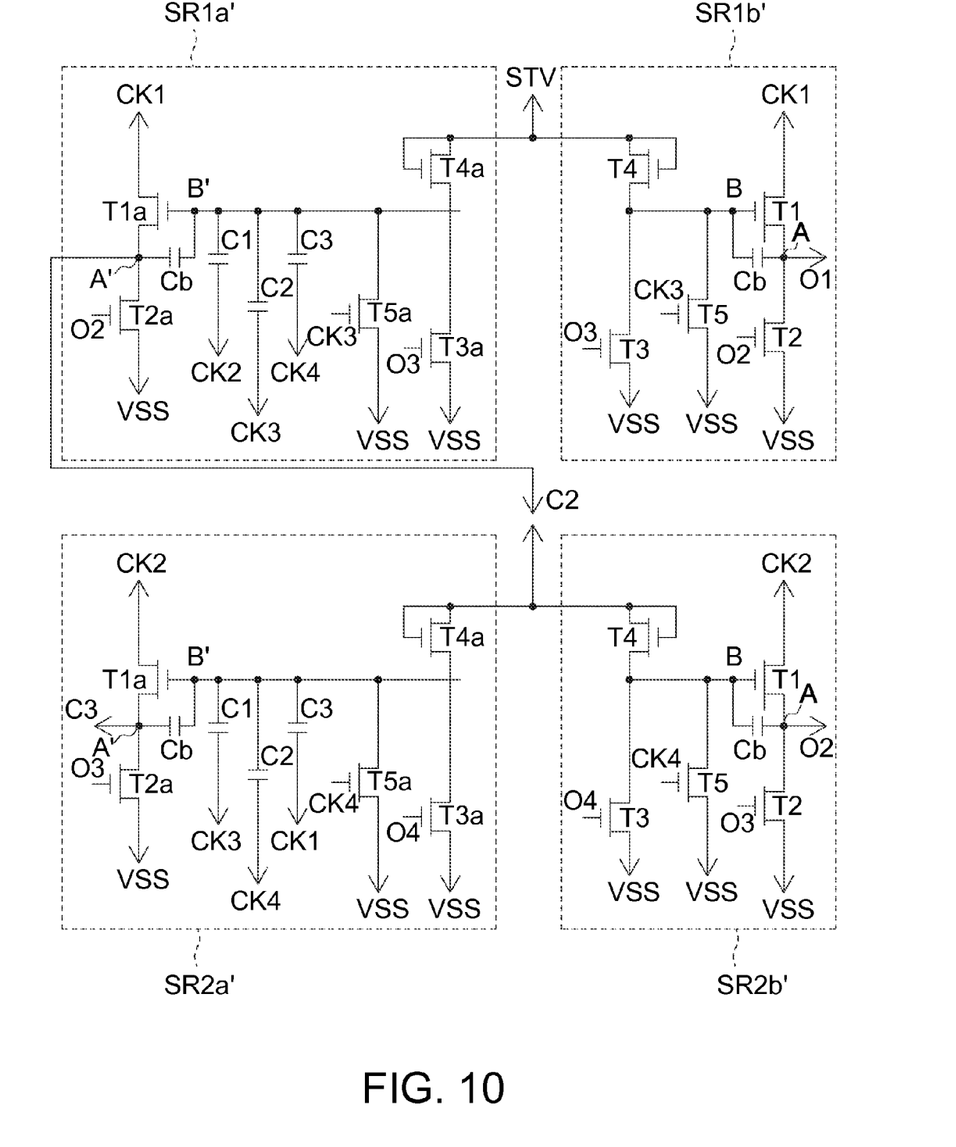
FIG. 10 shows a second circuit diagram of carry shift register and buffer shift register.
Figure 11:
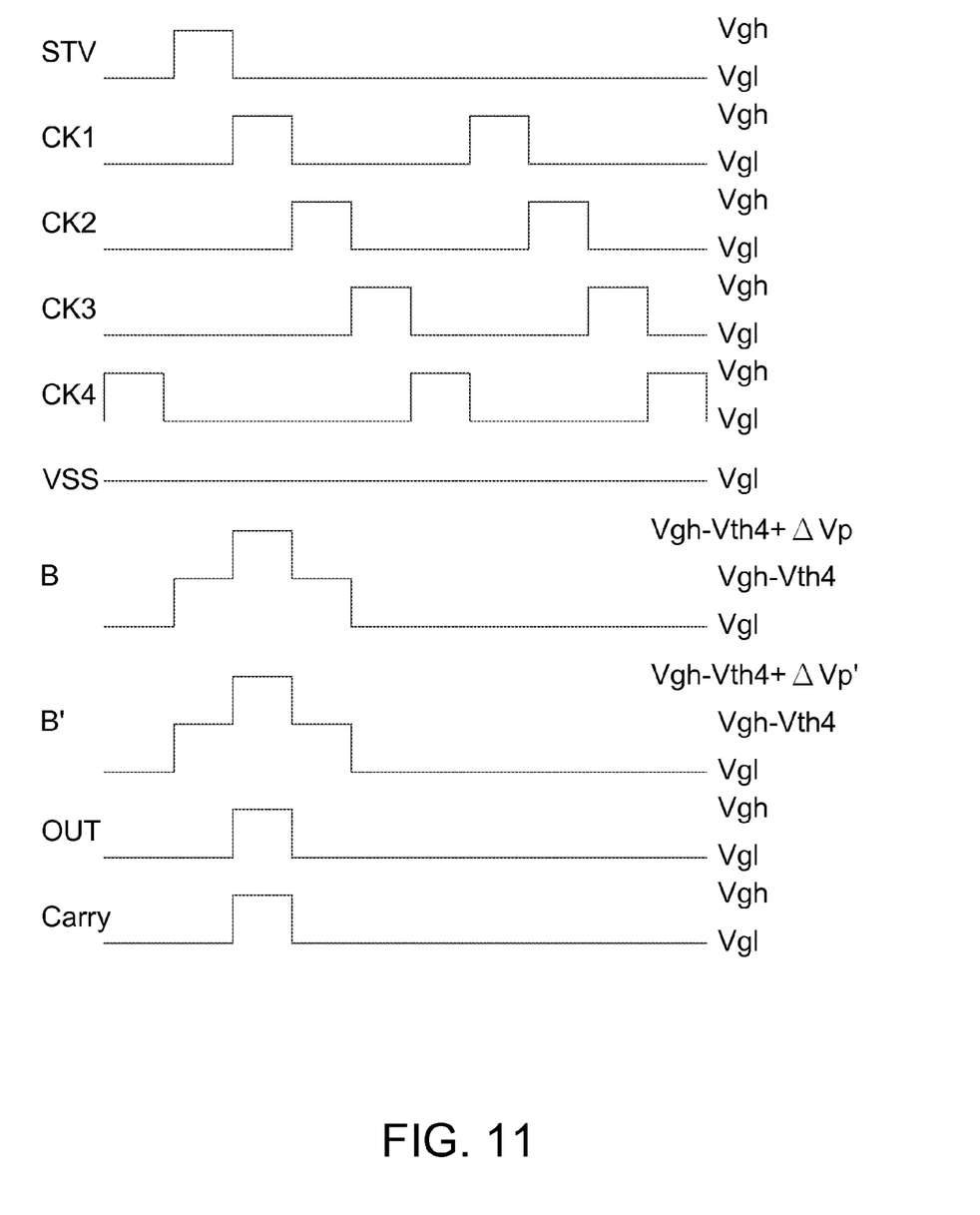
FIG. 11 shows a timing diagram of the signals of FIG. 10.

Referring to FIG. 10 and FIG. 11. FIG. 10 shows a second circuit diagram of carry shift register and buffer shift register. FIG. 11 shows a timing diagram of the signals of FIG. 10. The circuits of carry shift register and the buffer shift register can be realized by that illustrated in FIG. 8 or that illustrated in FIG. 10. The first stage carry shift register SR1a' of FIG. 10 is different from the first stage carry shift register SR1a of FIG. 8 in that: the first stage carry shift register SR1a' further comprises a transistor T5a, a regulation capacitor C1, a regulation capacitor C2 and a regulation capacitor C3, and that the transistor T3a is controlled by the third output signal O3. The transistor T5a is coupled to the transistors T1a, T3a and T4a via the node B', and is controlled by clock signal CK3. One terminal of regulation capacitor C1 is coupled to the control terminal of the transistor T1a, and the other terminal of the regulation capacitor C1 receives the clock signal CK2. One terminal of the regulation capacitor C2 is coupled to the control terminal of the transistor T1a, and the other terminal of the regulation capacitor C2 receives the clock signal CK3. One terminal of the regulation capacitor C3 is coupled to the control terminal of the transistor T1a, and the other terminal of the regulation capacitor C3 receives the clock signal CK4. The circuit design of the second stage carry shift register SR2a' is identical to that of the first stage carry shift register SR1a' and the similarities are not repeated here.

The first stage buffer shift register SR1b' of FIG. 10 is different from the first stage carry shift register SR1b of FIG. 8 in that: the first stage carry shift register SR1b' further comprises a transistor T5, and the transistor T3 is controlled by the third stage output signal O3. The transistor T5 is coupled to the transistors T1, T3 and T4 via the node B, and is controlled by the clock signal CK3. The circuit design of the second stage buffer shift register SR2b' is identical to that of the first stage buffer shift register SR1b', and the similarities are not repeated here.

Moreover, the design of the regulation capacitors C1~C3 suppresses the noises generated by the clock signal CK1. When the level of the clock signal CK1 rises, the potential of the node B will be affected due to the parasitic capacitance between the gate and source of the transistor T1a. Thus, the levels of the clock signals CK2~CK4 are stepped down to offset the rise in the level of the clock signal CK1 to assure the normal operation of the shift register circuit.

Second Embodiment

Figure 12:
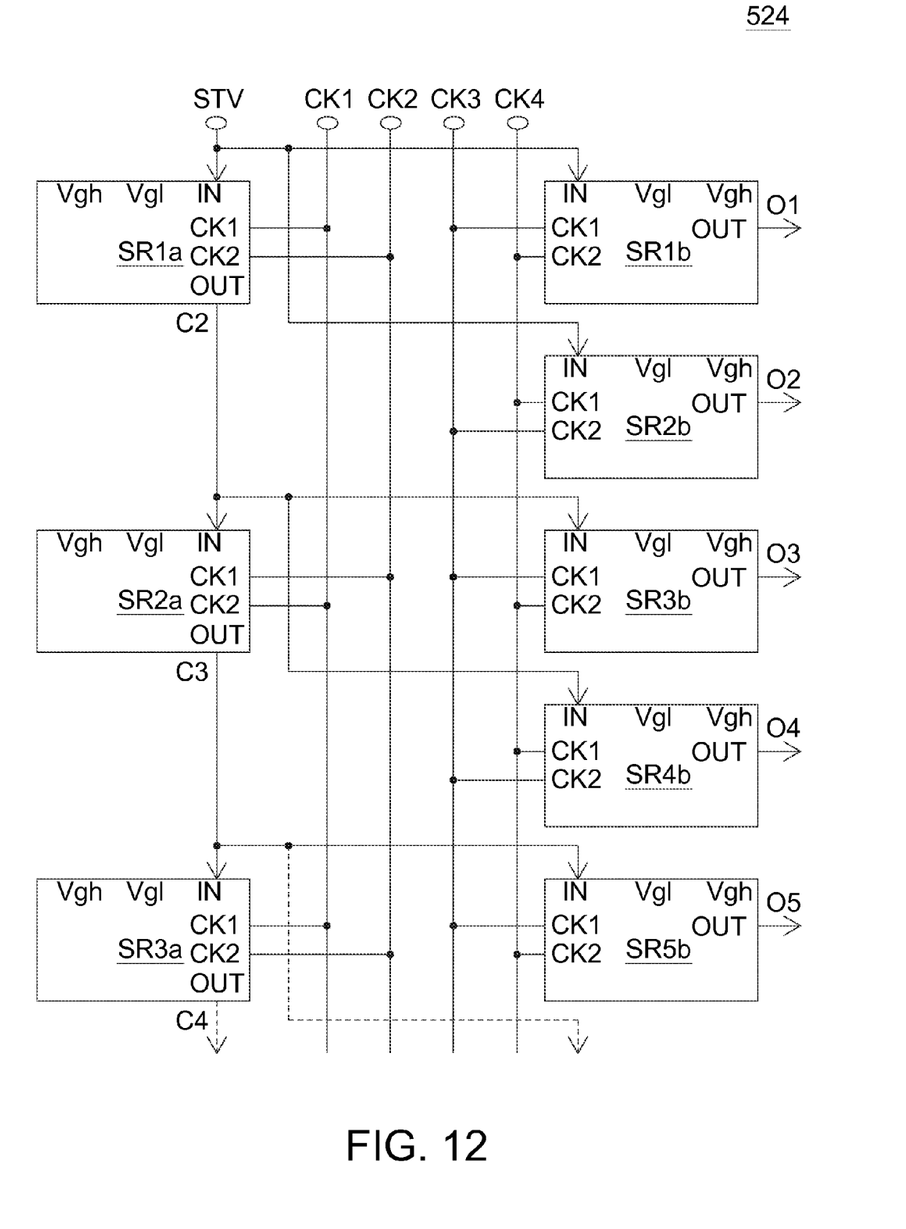
FIG. 12 shows a partial view of a shift register circuit according to a second embodiment of the disclosure.

Referring to FIG. 12, a partial view of a shift register circuit according to a second embodiment of the disclosure is shown. The second embodiment is different from the first embodiment in that: the number of the carry shift registers is different from that of the buffer shift registers. In the second embodiment, one stage of carry shift register goes with a plurality of stages of buffer shift registers. For convenience of elaboration, the second embodiment is exemplified by a shift register circuit in which one stage of carry shift register goes with two stages of buffer shift registers.

The scan driver 520 further comprises a shift register circuit 524. The shift register circuit 524 outputs a first stage output signal O1 to a fifth stage output signal O5 respectively corresponding to the scan signals S1~S5. The shift register circuit 524 comprises a first stage carry shift register SR1a to a third stage carry shift register SR3a and a first stage buffer shift register SR1b to a fifth stage buffer shift register SR5b. It is noted that in the shift register circuit 522, the number of the carry shift registers is smaller than that of the buffer shift registers. The first stage carry shift register SR1a to the third stage carry shift register SR3a respectively generate the second stage start signal C2 to the third stage start signal C4, and the first stage buffer shift register SR1b to the fifth stage buffer shift register SR5b respectively generate the first stage output signal O1 to the fifth stage output signal O5.

The first stage start signal STV starts the first stage carry shift register SR1a to generate a second stage start signal C2 at the node A'. The first stage start signal STV starts the first stage buffer shift register SR1b to output a first stage output signal O1 at the node A, and further starts the second stage buffer shift register SR2b to output a second stage output signal O2. The second stage start signal C2 starts the second stage carry shift register SR2a to generate a third stage start signal C3. The second stage start signal C2 starts the third stage buffer shift register SR3b to output a third stage output signal O3, and starts the fourth stage buffer shift register SR4b to output a fourth stage output signal O4. By the same token, in subsequent stages, the principles of the operations of the carry shift registers and the buffer shift registers are similar to that illustrated in the above disclosure, and the similarities are not repeated here.

Third Embodiment

Figure 13:
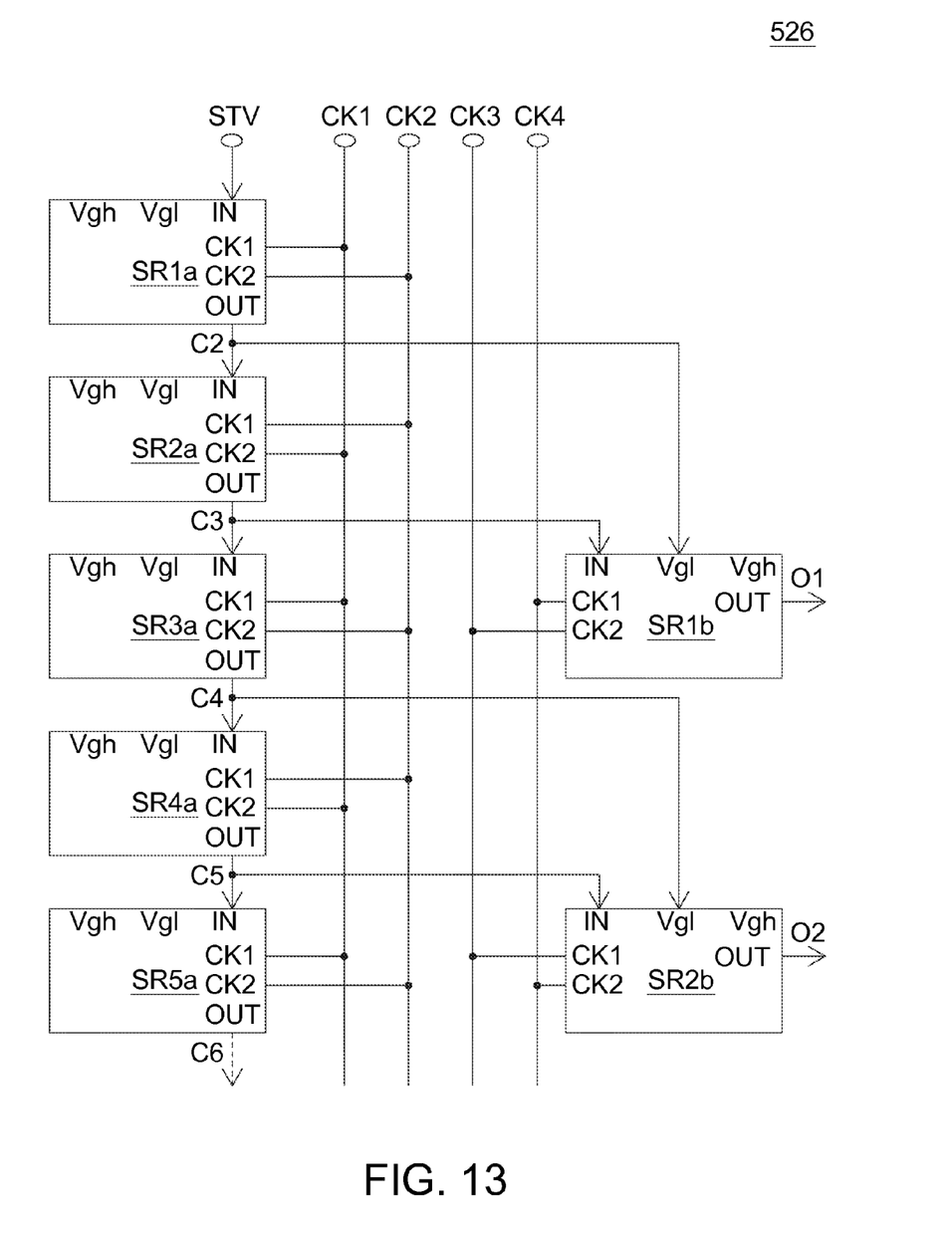
FIG. 13 shows a partial view of a shift register circuit according to a third embodiment of the disclosure.

Referring to FIG. 13, a partial view of a shift register circuit according to a third embodiment of the disclosure is shown. The third embodiment is different from the first embodiment in that: the number of the carry shift registers is different from that of the buffer shift registers. In the third embodiment, one stage of buffer shift register goes with a plurality of stages of carry shift registers. For convenience of elaboration, the third embodiment is exemplified by a shift register circuit in which one stage of buffer shift register goes with two stages of carry shift registers.

The scan driver 520 further comprises a shift register circuit 526. The shift register circuit 526 outputs the first stage output signal O1 and the second stage output signal O2 respectively corresponding to the scan signals S1~S2. The shift register circuit 526 comprises a first stage carry shift register SR1a to a fifth stage carry shift register SR5a and a first stage buffer shift register SR1b and a second stage buffer shift register SR2b. It is noted that in the shift register circuit 526, the number of the carry shift registers is different from that of the buffer shift register. The first stage carry shift register SR1a to the fifth stage carry shift register SR5a respectively generate the second stage start signal C2 to the sixth stage start signal C6. The first stage buffer shift register SR1b and the second stage buffer shift register SR2b respectively generate the first stage output signal O1 and the second stage output signal O2.

The first stage start signal STV starts the first stage carry shift register SR1a to generate a second stage start signal C2, and the second stage start signal C2 starts the second stage carry shift register SR2a to generate a third stage start signal C3. The second stage start signal C2 and the third stage start signal C3 start the first stage buffer shift register SR1b to output a first stage output signal O1.

The third stage start signal C3 starts the third stage carry shift register SR3a to generate a fourth stage start signal C4, which starts the fourth stage carry shift register SR4a to generate a fifth stage start signal C5. The fourth stage start signal C4 and the fifth stage start signal C5 start the second stage buffer shift register SR2b to output a second stage output signal O2. By the same token, in subsequent stages, the principles of the operations of the carry shift registers and the buffer shift registers are similar to that illustrated in the above disclosure, and the similarities are not repeated here.

The shift register circuit and the display disclosed in the above embodiments of the disclosure have many advantages exemplified below:

Firstly, the noises generated due to the clock signals are suppressed to assure the normal operation of the shift register circuit.

Secondly, the noises generated by the display region of the panel are suppressed to assure the normal operation of the shift register circuit.

While the disclosure has been described by way of example and in terms of the exemplary embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
   a panel, comprising:
      a plurality of pixels;
      a plurality of data lines transmitting a plurality of data signals to the pixels;
      a plurality of scan lines transmitting a plurality of scan signals to the pixels;
   a data driver providing the data signals; and
   a scan driver providing the scan signals, wherein the scan driver comprises:
      a shift register circuit, comprising:
         an i-th stage shift register comprising:
            a first transistor having a first control terminal and a first outputting terminal; and
            a second transistor having a second control terminal and a second outputting terminal,
      wherein the first control terminal electrically couples to an i-th start signal and the first outputting terminal generates an i+1th start signal, wherein the second control terminal electrically couples to the i-th start signal and the second outputting terminal generates an i-th output signal, and wherein the i-th start signal and the i-th output signal have the same high level voltage.

2. The display according to claim 1, wherein the i-th stage shift register further comprises:
   a fourth transistor having a first terminal coupled to the second transistor via the second outputting terminal, a second terminal receiving an i+1th output signal, and a third terminal receiving a constant voltage.

3. The display according to claim 1, wherein the i-th stage shift register further comprises:
   a ninth transistor coupled to the first control terminal, for driving the first transistor according to the i-th start signal; and
   a tenth transistor coupled to the second control terminal, for driving the second transistor according to the i-th start signal.

4. The display according to claim 1, wherein the i-th stage shift register further comprises:
   a seventh transistor coupled to the first control terminal, wherein a control terminal of the seventh transistor receives a clock signal.

5. The display according to claim 4, wherein the i-th stage shift register further comprises:
   an eighth transistor coupled to the second control terminal, wherein a control terminal of the eighth transistor receives the clock signal.

6. The display according to claim 1, wherein the i-th stage shift register further comprises:
   a third transistor having a first terminal coupled to the first transistor via the first outputting terminal, a second terminal receiving an i+1th output signal, and a third terminal receiving a constant voltage.

7. The display according to claim 6, wherein the i-th stage shift register further comprises:
   a fifth transistor coupled to the first control terminal.

8. The display according to claim 7, wherein
   a control terminal of the fifth transistor receives the i+1th output signal; or
   the control terminal of the fifth transistor receives an i+2th output signal.

9. The display according to claim 6, wherein the i-th stage shift register further comprises:
   a sixth transistor coupled to the second control terminal.

10. The display according to claim 9, wherein
    a control terminal of the sixth transistor receives the i+1th output signal; or
    the control terminal of the sixth transistor receives an i+2th output signal.

* * * * *